(12) United States Patent
Kiesewetter et al.

(10) Patent No.: US 8,402,848 B2
(45) Date of Patent: Mar. 26, 2013

(54) PROBE HOLDER

(75) Inventors: Joerg Kiesewetter, Sacka (DE); Stojan Kanev, Thiendorf OT Sacka (DE); Stefan Kreissig, Venusberg (DE)

(73) Assignee: Cascade Microtech, Inc., Beaverton, OR (US)

( * ) Notice: Subject to any disclaimer, the term of this patent is extended or adjusted under 35 U.S.C. 154(b) by 290 days.

(21) Appl. No.: 12/681,967

(22) PCT Filed: Oct. 10, 2008

(86) PCT No.: PCT/EP2008/063678
§ 371 (c)(1),
(2), (4) Date: Jul. 20, 2010

(87) PCT Pub. No.: WO2009/050127
PCT Pub. Date: Apr. 23, 2009

(65) Prior Publication Data
US 2010/0294053 A1 Nov. 25, 2010

(30) Foreign Application Priority Data
Oct. 10, 2007 (DE) .......................... 10 2007 048 816

(51) Int. Cl.
*G01N 15/00* (2006.01)
(52) U.S. Cl. ...................................... 73/866.5
(58) Field of Classification Search .................. 73/866.5
See application file for complete search history.

(56) References Cited

U.S. PATENT DOCUMENTS

| | | | | |
|---|---|---|---|---|
| 5,761,823 A * | 6/1998 | Williamson et al. | ............ | 33/832 |
| 6,011,405 A * | 1/2000 | Sikora | ....................... | 324/750.22 |
| 6,864,697 B1 * | 3/2005 | Lin | ........................... | 324/750.25 |
| 7,579,849 B2 * | 8/2009 | Kiesewetter et al. | ..... | 324/756.03 |
| 7,859,278 B2 * | 12/2010 | Runge et al. | ............. | 324/754.07 |
| 2003/0042921 A1 | 3/2003 | Hollman | | |
| 2004/0140794 A1 | 7/2004 | Back | | |
| 2004/0207424 A1 * | 10/2004 | Hollman | ...................... | 324/758 |

FOREIGN PATENT DOCUMENTS

EP 1204133 A 5/2002

OTHER PUBLICATIONS

International Search Report for PCT/EP2008/063678 dated Mar. 31, 2009.

* cited by examiner

*Primary Examiner* — Hezron E Williams
*Assistant Examiner* — Rodney T Frank
(74) *Attorney, Agent, or Firm* — Dascenzo Intellectual Property Law, P.C.

(57) ABSTRACT

A probe holder has a manipulator, a probe arm arranged on the manipulator, and a probe needle that is at least indirectly connected to the probe arm. To increase the number of contacts of a substrate to be tested and to make it possible to test a plurality of contacts in etched trenches of semiconductor elements in a group of wafers, the probe arm is connected to a needle support on which the probe needle and at least one second probe needle are arranged.

7 Claims, 10 Drawing Sheets

PROBE HOLDER

CROSS REFERENCE TO RELATED APPLICATIONS

Figure 1:
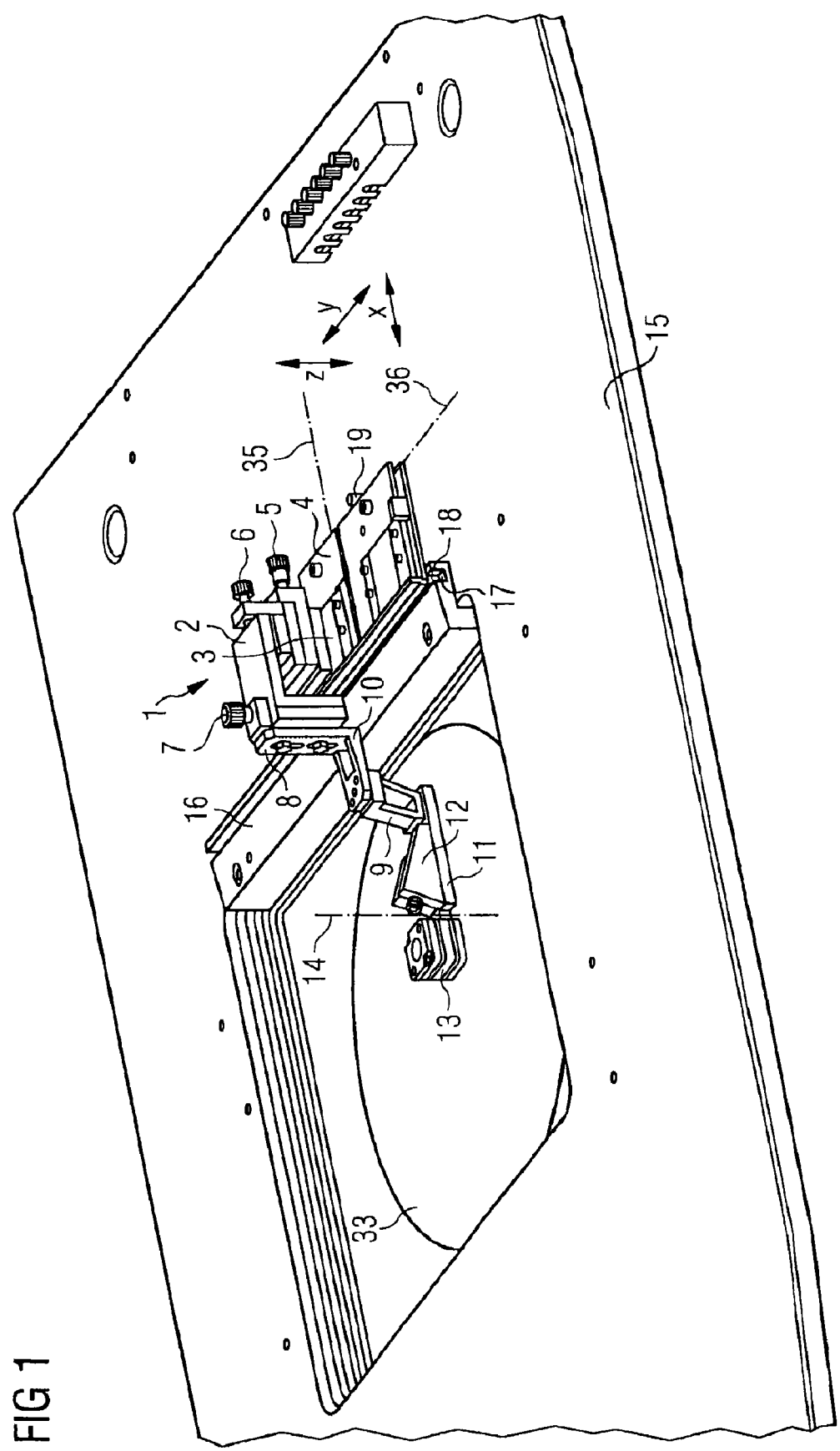

This application is a national stage filing under section 371 of International Application No. PCT/EP2008/063678 filed on Oct. 10, 2008, and published in German on Apr. 23, 2009 as WO 2009/050127 and claims priority of German application No. 10 2007 048 816.7 filed on Oct. 10, 2007, the entire disclosure of these applications being hereby incorporated herein by reference.

BACKGROUND ART

The invention concerns a probe holder, which can be connected to a probe holder plate of a prober. This probe holder plate includes a manipulator with a base surface, a probe arm receptacle and adjustment devices. The probe holder also includes a probe arm and a probe needle that can contact a substrate being tested. The probe arm then has a longitudinal extent between a first and a second end and is fastened with the first end to the probe arm receptacle. The probe arm accommodates the probe needle on the second end. The probe arm receptacle is then adjustable in a z-direction running perpendicular to the base surface, an x-direction running perpendicular to the z-direction and parallel to the longitudinal extent of the probe arm and in a y-direction, both perpendicular to the z-direction and perpendicular to the y-direction by means of the adjustment device.

The invention pertains to those probe holders that can be used on so-called probers. Prober is subsequently understood to mean a test device that tests electrical functions of substrates, having a probe holder plate, on which the probe holder can be mounted and locked. The probe holder plate then has a passage opening to the substrate lying beneath the probe holder plate, through which the probe arms pass.

Such probe holders are known, which are mounted on the probe holder plate and can be connected to it after an adjustment. A vacuum suction device is then arranged beneath the base surface, for example.

It is possible, by means of several of these probe holders, to set probe needles according to a pattern of contacts on the substrates being tested, for example, semiconductor components. The semiconductor components are then tested in the wafer structure, so that each semiconductor component, which has the same contact pattern, can be brought beneath the contact needles and placed in contact with them in succession.

A shortcoming is then that the number of probe holders on the probe holder plate is limited by the dimensions of the manipulator.

It is now common to test not only contacts on substrates in semiconductor technology, but also scribing pits between the semiconductor components for test purposes. For this purpose a number of contact islands are arranged in the scribing pits, which help evaluate process parameters, for instance. The cost to set up a test structure with ordinary probe holders is connected with intolerably high expense.

BRIEF SUMMARY OF INVENTION

The underlying task of the invention is therefore to devise a possibility of increasing the number of contacts on a substrate being tested. Another task of the invention is to devise an advantageous possibility of testing a number of contacts in scribing pits of semiconductor components in a wafer composite.

The task is solved according to the invention by a substrate holder with the features of Claim 1. Claims 2 to 7 provide features of advantageous variants of the invention.

BRIEF DESCRIPTION OF DRAWING FIGURES

Figure 3:
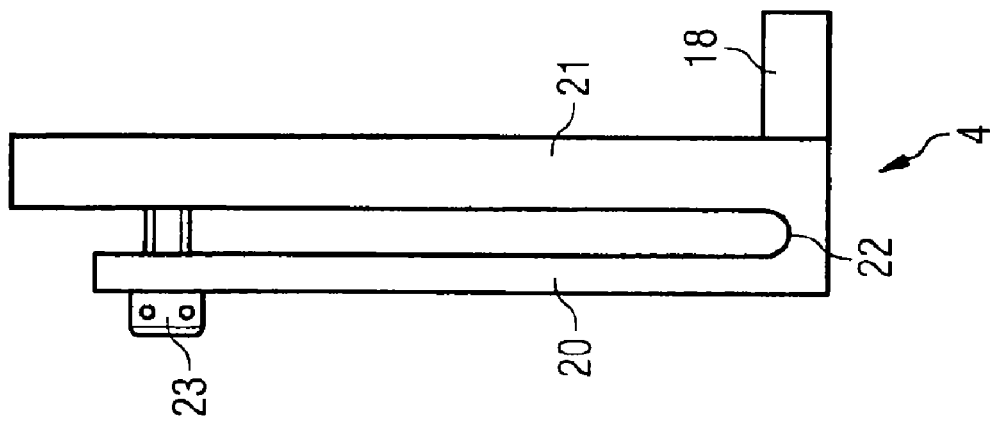
Figure 2:
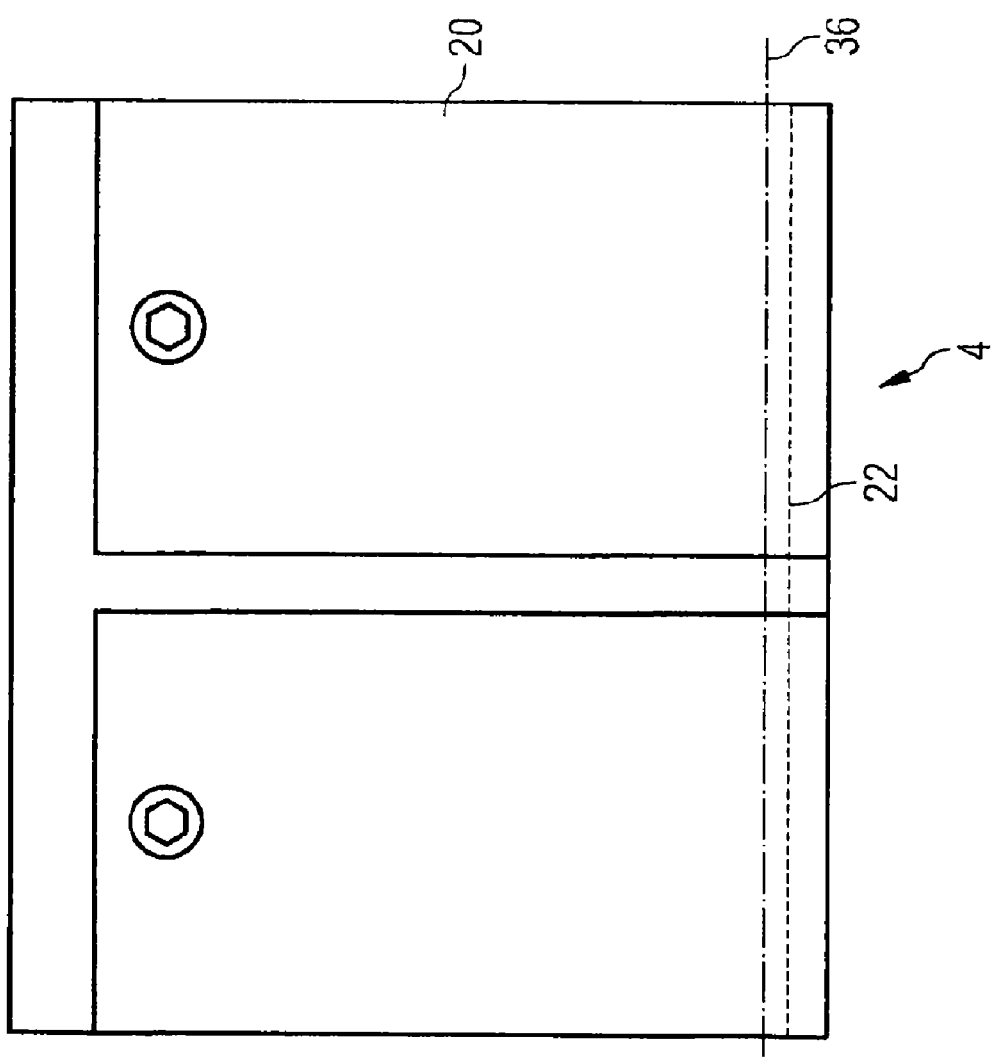
Figure 4:
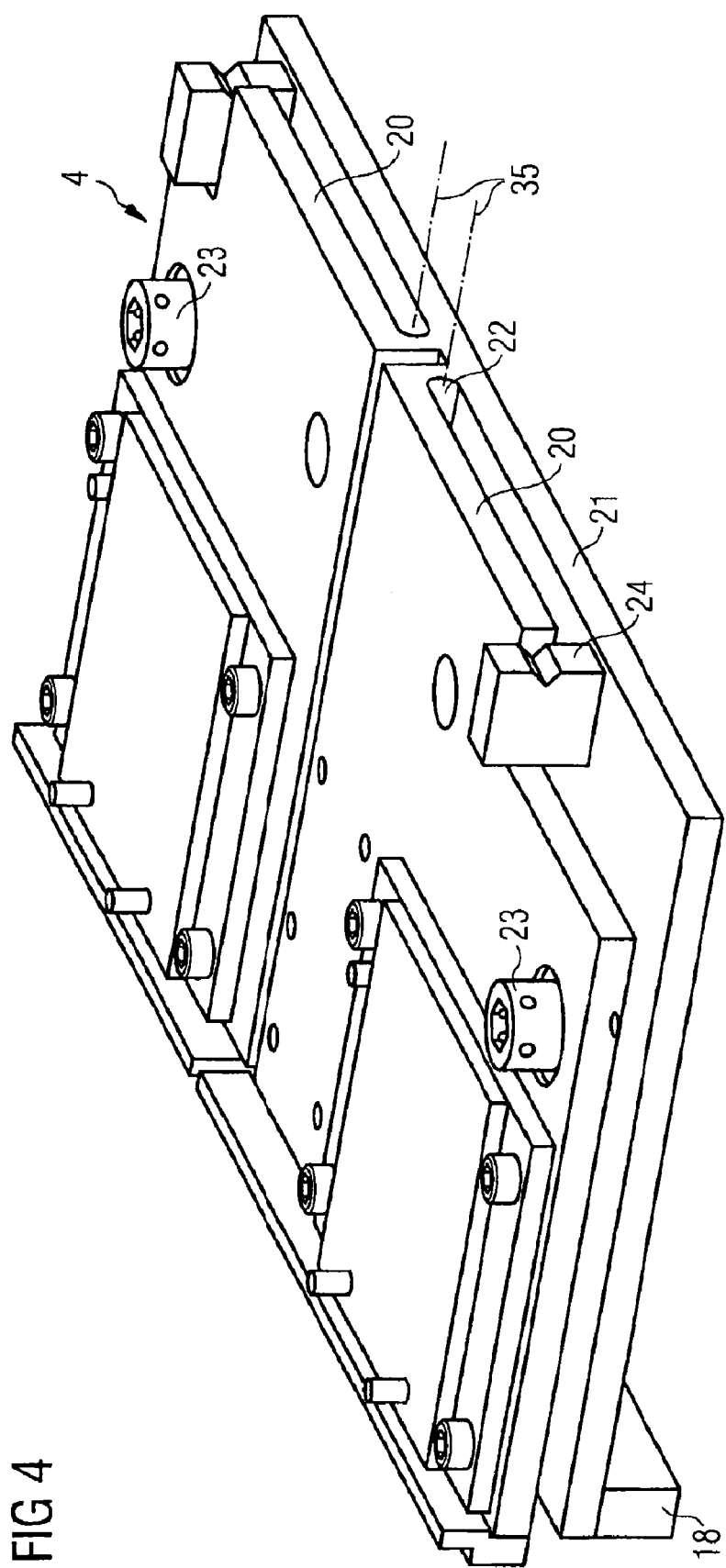
Figure 5:
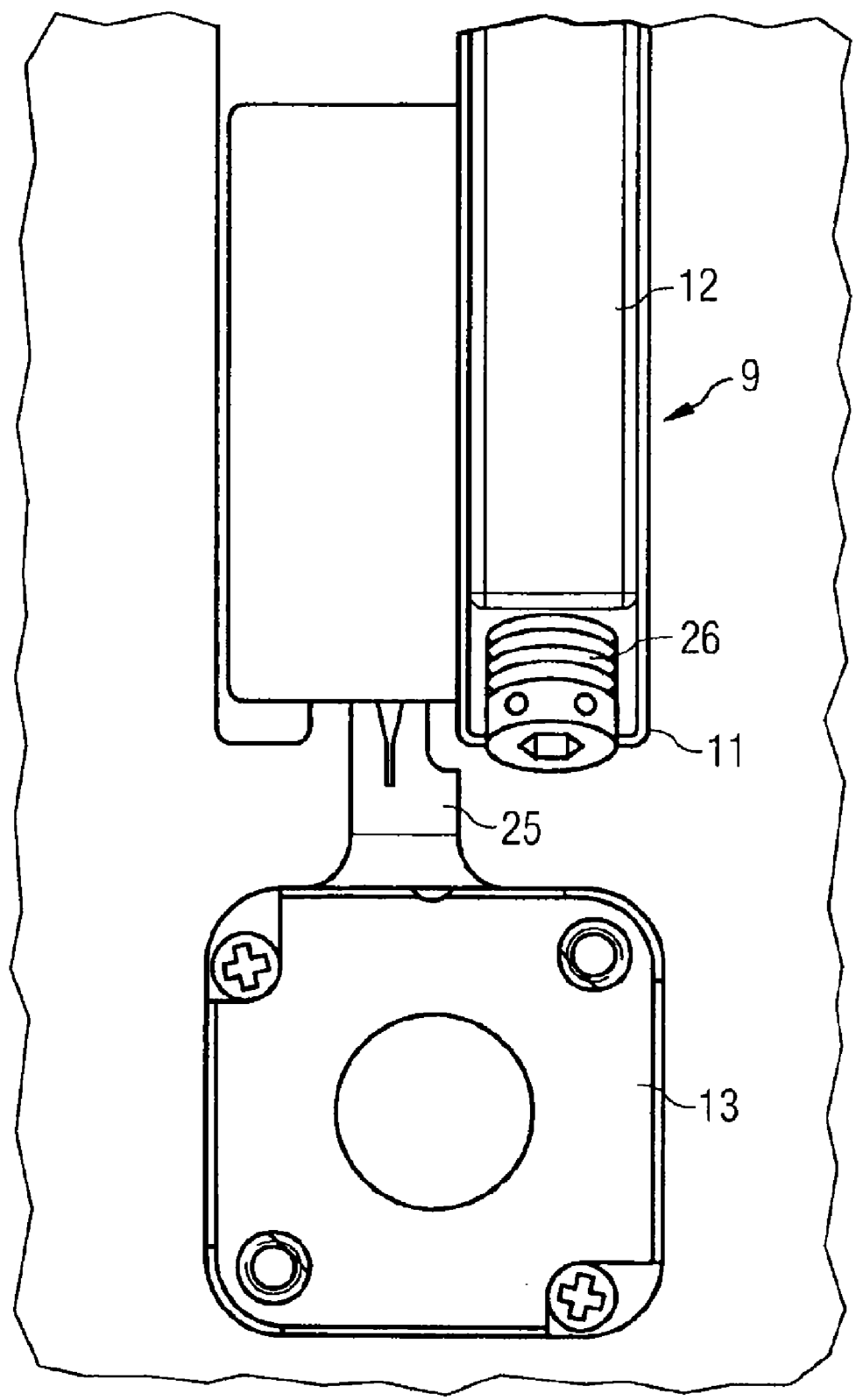
Figure 6:
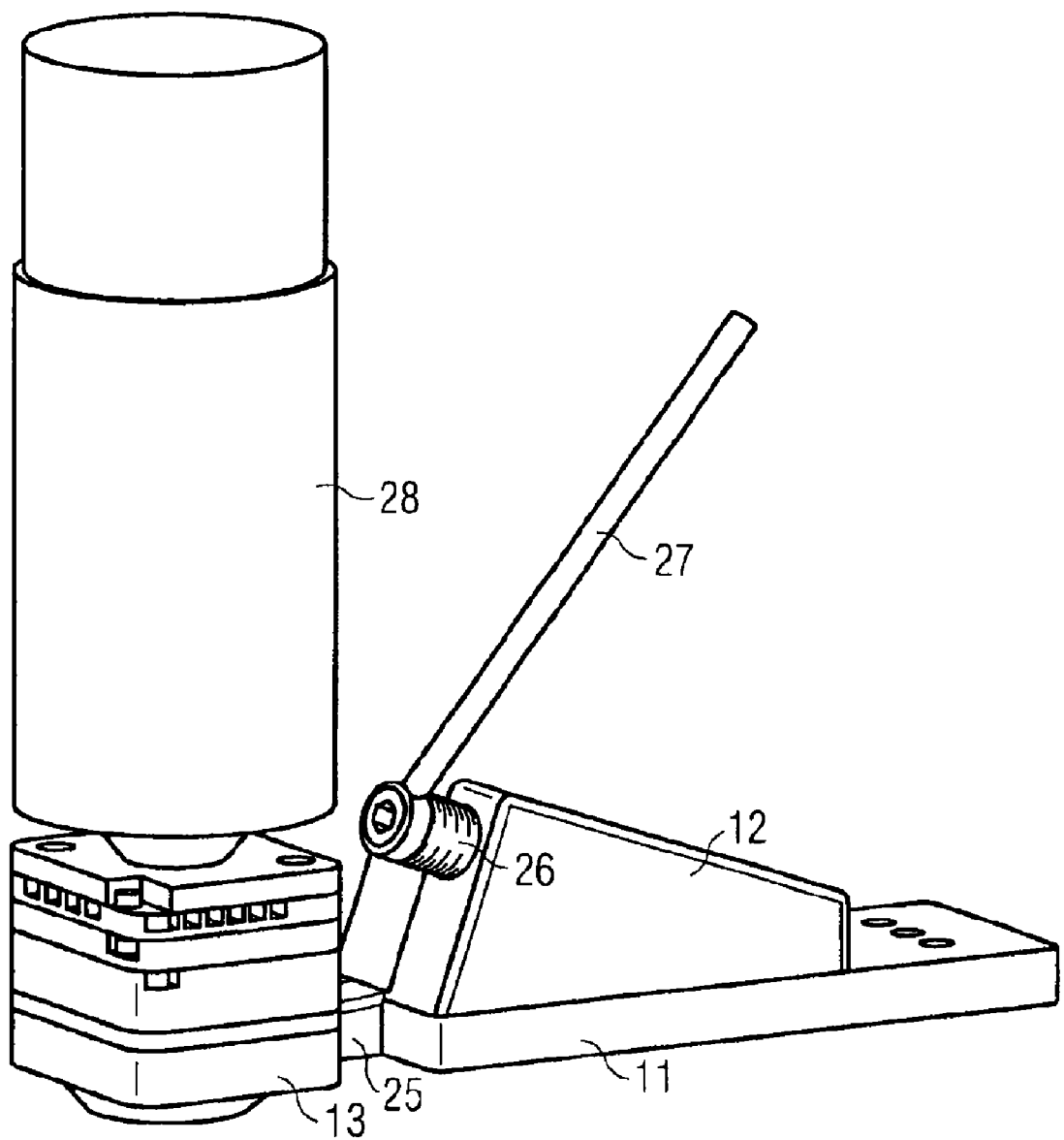
Figure 7:
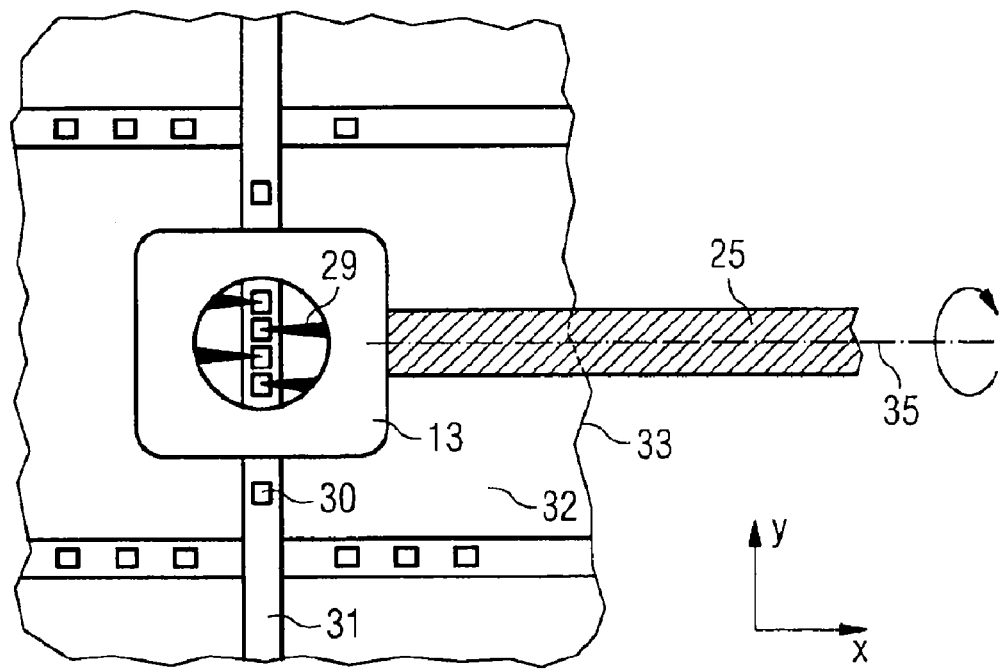
Figure 8:
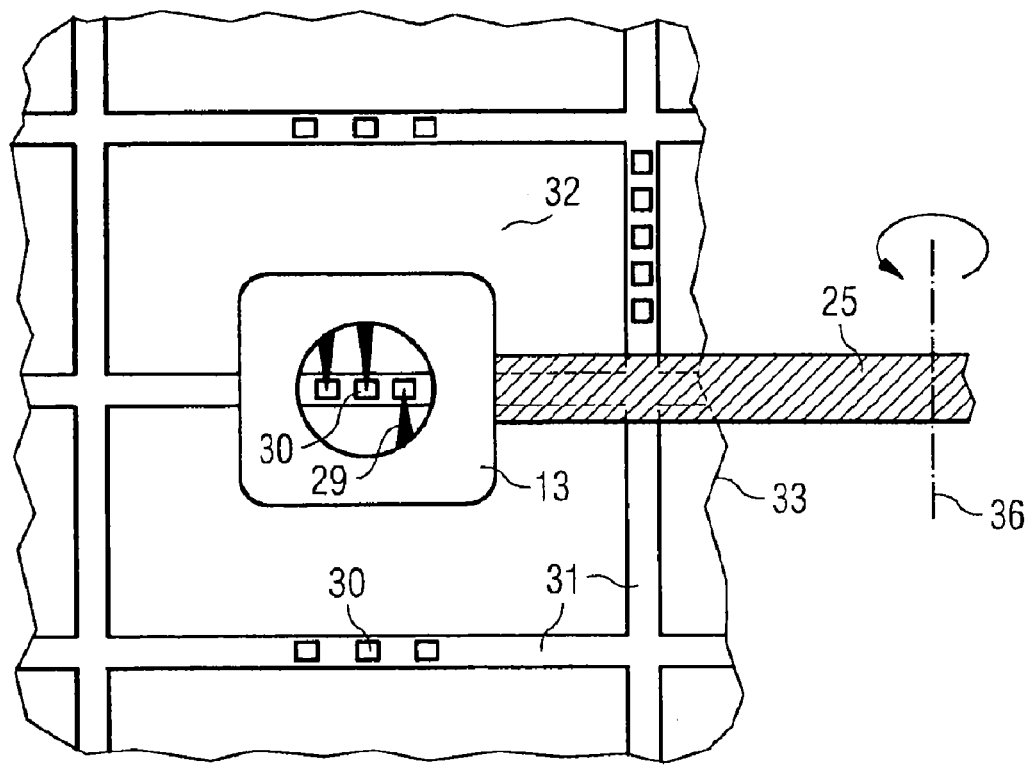
Figure 9:
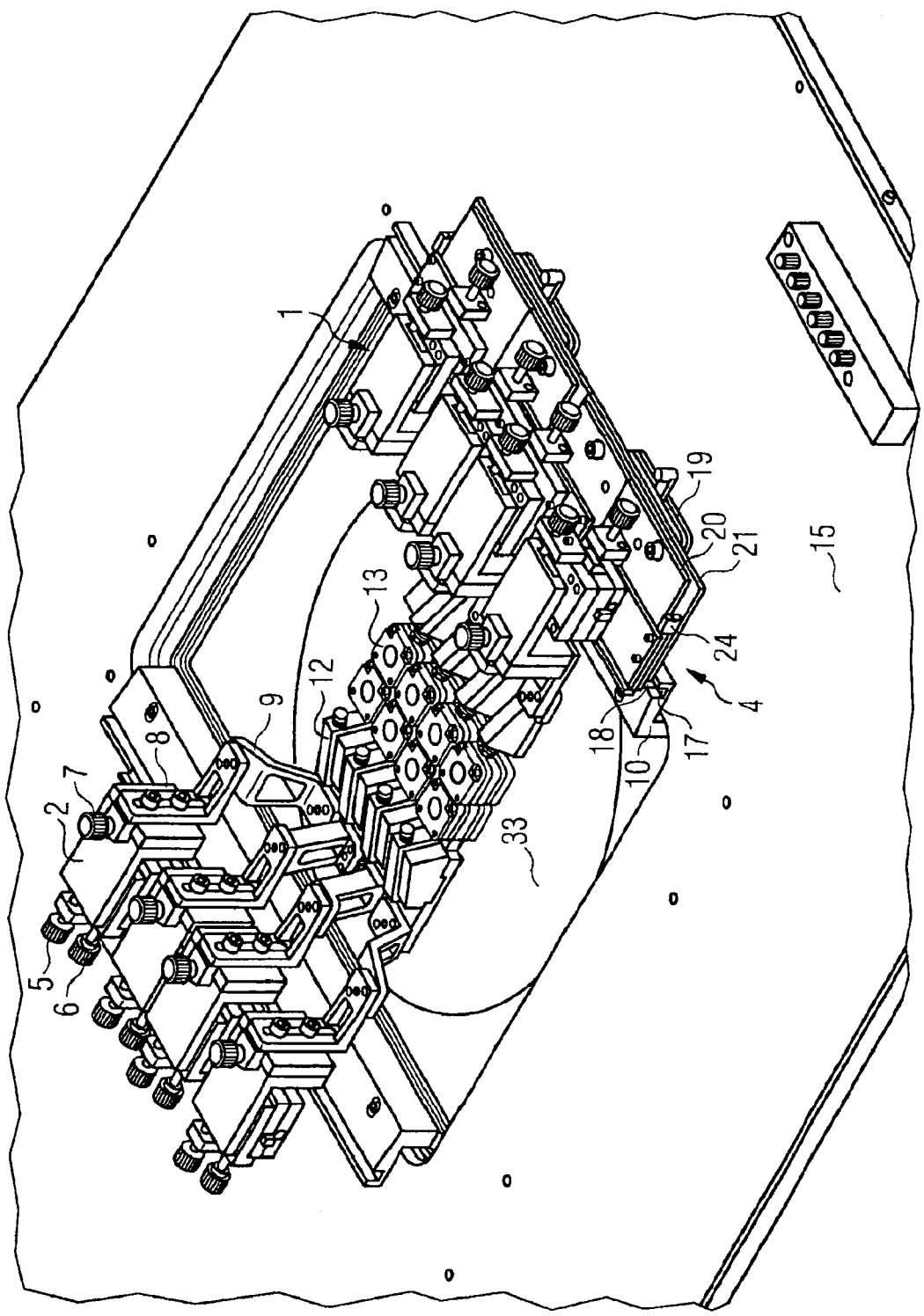
Figure 10:
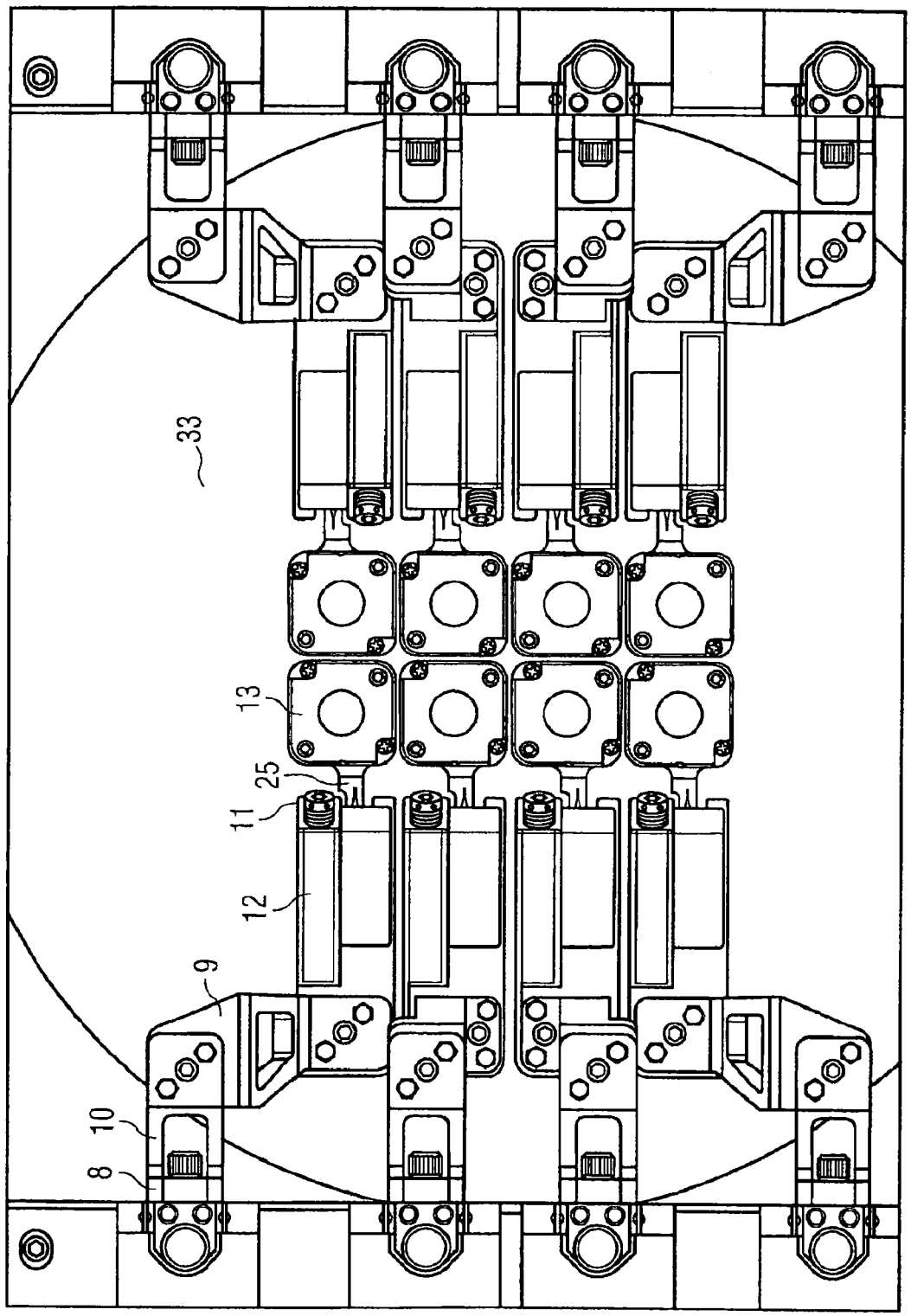
Figure 11:
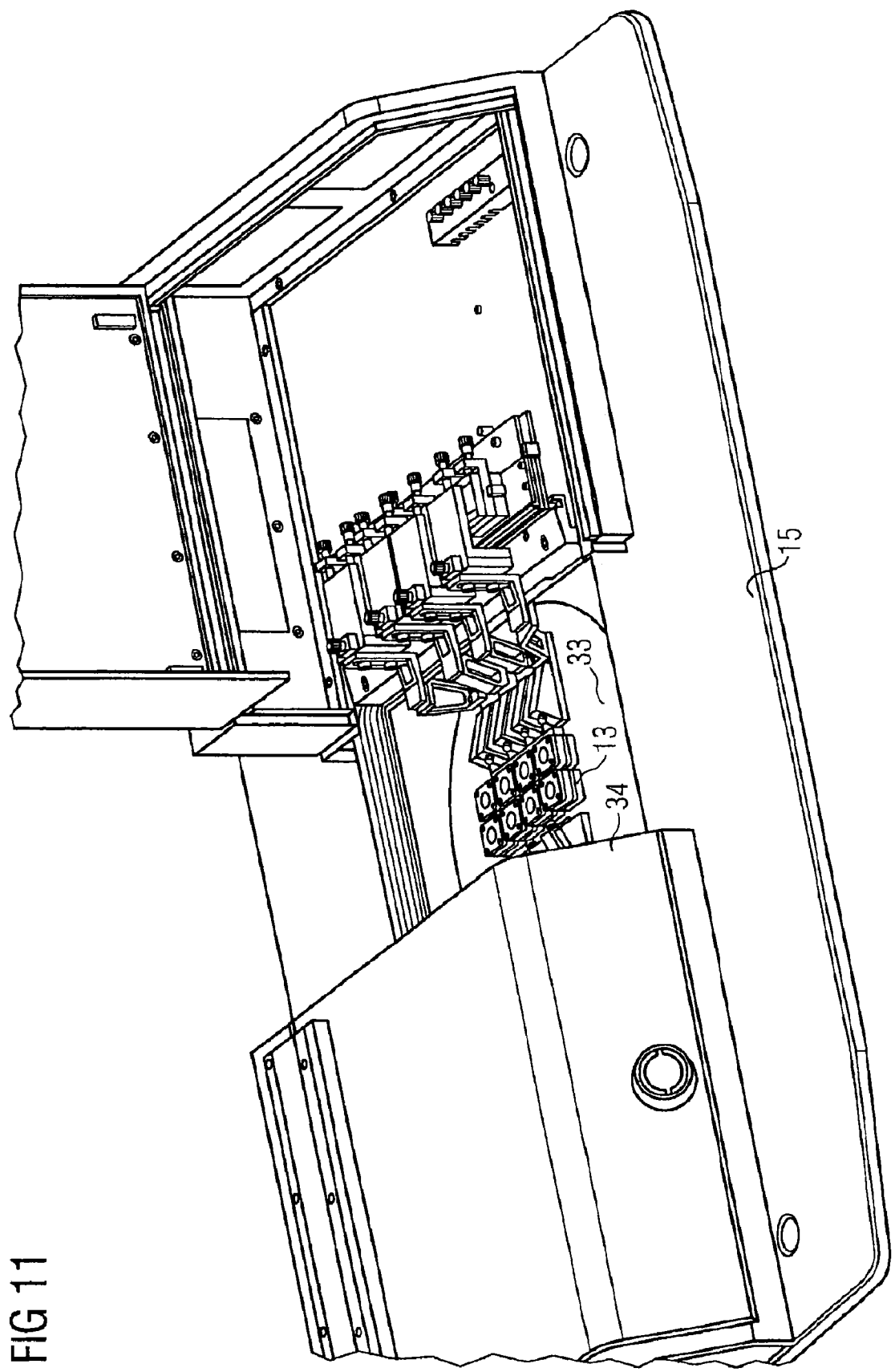
Figure 12:
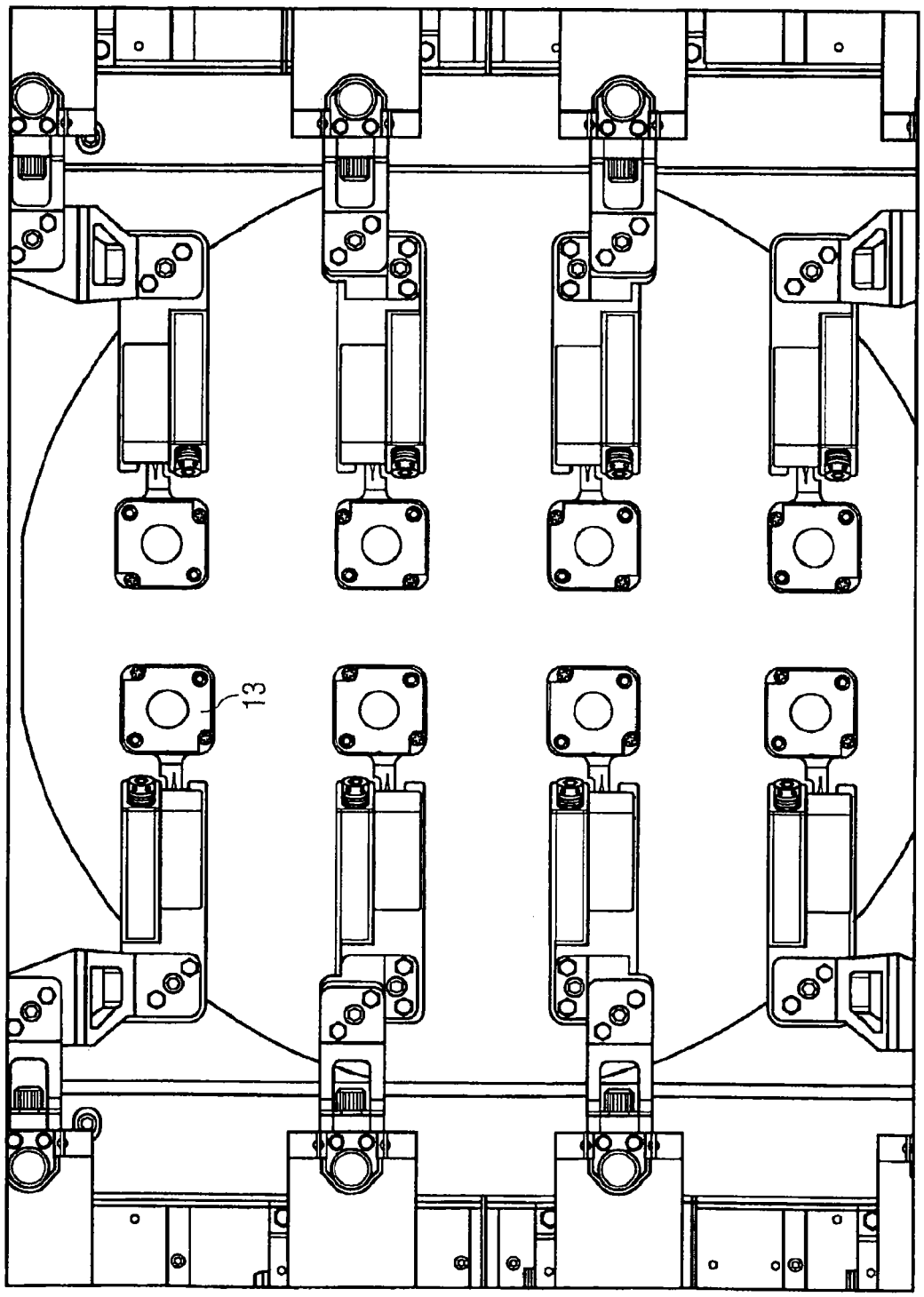

The invention will be explained below by means of a practical example. In the corresponding drawings:

FIG. 1 shows a perspective view of a probe holder according to the invention on a probe holder plate, FIG. 2 shows a top view of a pivot base according to the invention with a second base pivot axis lying in the y-direction, FIG. 3 shows a side view of the pivot base according to the invention according to FIG. 2, FIG. 4 shows a perspective view of a pivot base according to the invention with a first base pivot axis lying in the x-direction, FIG. 5 shows a top view of a probe holder according to the invention, FIG. 6 shows a perspective view of an angle adjustment device according to the invention with a probe card connected to it, FIG. 7 shows the use of a probe card according to the invention with pivot capability in the x-direction, FIG. 8 shows use of a probe card according to the invention with pivot capability in the y-direction around a second base pivot axis, FIG. 9 shows a multiple arrangement of substrate holders according to the invention for testing of contacts in scribing pits on a semiconductor wafer, FIG. 10 shows a top view of the arrangement according to FIG. 9, FIG. 11 shows a number of substrate holders according to the invention, used in a prober with shielding of the substrate holders and FIG. 12 shows a top view of a number of substrate holders according to the invention with a spacing from each other.

DETAILED DESCRIPTION

According to the view in FIG. 1, a probe holder 1 according to the invention has a manipulator 2. This manipulator 2 is supported with its base surface 3 on a pivot base 4 and fastened to it. The movement directions x, y and z are schematically shown by arrows in FIG. 1. By means of adjustment screws 5, 6 and 7, the probe arm receptacle 8 can be adjusted in the x-, y- and z-directions. A probe arm 9 with a first end 10 is fastened to the probe arm receptacle 8. On its second end 11, an angle adjustment device 12 is arranged. This angle adjustment device 12 is connected to a probe card 13. The probe card 13 can be pivoted around a pivot axis 14 lying in the z-direction by the angle adjustment device 12.

The probe holder 1 is connected to a probe holder plate 15, specifically so that a rail 16 is firmly connected to the probe holder plate 15. This rail 16 has an alignment groove 17, into which an alignment tab 18 engages. This alignment tab 18 is connected to the pivot base 4, via which the probe holder 1 is then fastened to the pivot base 4 by connection of the base surface 3. The pivot base 4 is provided on the bottom with a magnetic holder 19, which supports the pivot base 4 on one side on the probe holder plate 15 and locks it on the other side.

As shown in FIG. 2 and FIG. 3, a pivot base 4 according to the invention consists of an upper plate 20 and a lower plate 21. A first base pivot axis 35 can then run in the x-direction or a second base pivot axis 36 in the y-direction.

In a not further shown variant, the pivot base 4 can be made pivotable, both with the first base axis 35 and with the second base pivot axis 36.

FIG. 2 and FIG. 3 show the relation between the alignment tab 18 in the position of the solid joint 22, which extends here it the direction of the second base pivot axis 36 in the y-direction. In a pivot base 4 shown in FIG. 4, the solid joint 22 is aligned perpendicular to the alignment tab 18, which means that the base pivot axis 35 of this pivot base runs in the x-direction. Depending on the desired alignment of the probe card 13, a pivot base according to the depiction in FIG. 2 and FIG. 3 or the depiction in FIG. 4 will be used. Both variants provide that two pivot bases 4 are arranged on a common lower plate 21. Because of this, it is possible to arrange several probe holders 1 right next to each other. The pivot bases 4 can then be pivoted independently in the first base pivot axis 35 running in the x-direction or in the second base pivot axis 36 running in the y-direction or in both base pivot axes 35 and 36.

In order to be able to exactly interpret the angle in a pivot base 4 that is set via the set screw 23, a deflection display 24 is provided.

FIG. 5 shows, in an enlarged view, the second end 11 of a probe arm 9, on which an angle adjustment device 12 is arranged, with which the probe card 13 is connected via a connection element 25. The probe card 13 can be pivoted around the pivot axis 14 by means of set screw 26.

As still to be shown, several probe holders 1 can be arranged in a shielded enclosure. Accessibility to the set screw 26 might then be hampered. For this reason, as shown in FIG. 6, a control lever 27 can be provided, with which the set screw 26 can be operated.

As also shown in FIG. 6, a microscope objective 28 can be mounted on the probe card, in order to be able to adjust positioning of the probe card with reference to the contact islands.

The use of a probe card according to the invention is now shown in FIGS. 7 and 8. As can be seen, the probe card 13 has probe needles 29, which are supposed to contact the contact islands 30 arranged on the scribing pits 31 between semiconductor components 32 on a semiconductor wafer 33. These scribing pits in FIG. 7 are to be contacted in the y-direction. For this reason, in a probe holder plate for contacting of the contact islands according to FIG. 7, a pivot base 4 according to the depiction in FIG. 4 is used. The contact islands 30 to be contacted lie in FIG. 8 in scribing pits 31 that run in the x-direction. For this reason, for alignment of the probe needles 29, the probe card 13 should be pivotable around a second base pivot axis 36 lying in the y-direction, which is achieved by a pivot base 4 according to the depiction in FIG. 2 and FIG. 3.

As shown in FIG. 9, several probe holders 1 are provided, which position several probe cards 13, so that a number of contact islands 30 can be contacted in the scribing pits 31, both in the x- and y-direction on a semiconductor wafer 33. Such a packing density is not attainable with probe holders according to the prior art.

To compensate for spatial distance between manipulators 2, as shown in FIG. 9, it is proposed to provide the probe arms 9 with different bends that can be mounted differently, so that a very tight density of probe cards 13 can be reached.

As shown in FIG. 9, it is very apparent that by such an arrangement, a high packing density of probe cards 13 and therefore of probe needles 29 can be reached and, consequently, contact islands 30 in scribing pits 31 that are aligned in both the x-direction and in the y-direction can simultaneously be contacted.

As shown in FIG. 11, several probe holders 1 according to the invention can be accommodated within a housing 34, where the housing 34 can serve to shield the probe holders 1, both in the electromagnetic direction, and also from thermal effects. By configuration of the probe holders 1 according to the invention, it is consequently possible to arrange a number of probe cards 13 and leave them in this connection, without having to be readjusted, which would entail opening of the housing 34.

Finally, it is shown in FIG. 12 that a large distance between the probe cards 13 can also be adjusted with spaced arrangement of the probe holders 1 according to the invention.

The invention claimed is:

1. A probe holder, which can be connected to a probe holder plate of a prober, which has:
   a manipulator, with a base surface, a probe arm receptacle and adjustment screws;
   a probe arm that has a longitudinal extent between a first end and a second end and is fastened with the first end to the probe arm receptacle, wherein the probe arm receptacle is adjustable, by means of the adjustment screws, in a z-direction that defines a z-pivot axis and runs perpendicular to the base surface and perpendicular to a surface of a substrate being tested, in an x-direction that defines an x-pivot axis and runs perpendicular to the z-direction and parallel to the longitudinal extent of the probe arm, and in a y-direction that defines a y-pivot axis and runs both perpendicular to the z-direction and perpendicular to the x-direction;
   a needle carrier connected to the second end of the probe arm;
   a plurality of probe needles that can contact the substrate being tested and that are arranged on the needle carrier; and
   a pivot base that is located between the probe holder and the probe holder plate and pivots the needle carrier relative to the substrate being tested about at least one of the x-pivot axis and the y-pivot axis.

2. The probe holder according to claim 1, wherein the pivot base has a lower plate and an upper plate arranged at a spacing above the lower plate, wherein the lower plate and the upper plate connected with each other to pivot about at least one of the x-pivot axis and the y-pivot axis so that, by an adjustment device, an angle enclosed by the lower plate and the upper plate can be adjusted.

3. The probe holder according to claim 2, wherein a solid joint is arranged between the lower plate and the upper plate of the pivot base.

4. The probe holder according to claim 2, wherein a rail is connected to the probe holder plate in the x-direction or the y-direction, and further wherein the rail has a first alignment guide that corresponds to a second alignment guide on a bottom of the lower plate of the pivot base.

5. The probe holder according to claim 4, wherein the first alignment guide comprises an alignment groove and the second alignment guide comprises an alignment tab that engages in the alignment groove.

6. The probe holder according to claim 1, wherein an angle adjustment device to pivot the needle carrier about the z-pivot axis is arranged between the probe arm and the needle carrier.

7. The probe holder according to claim 1, wherein the needle carrier comprises a probe card, on which the plurality of probe needles is arranged, and the plurality of probe needles is connected electrically or in data transmission mode to a test device via the probe card.

* * * * *

UNITED STATES PATENT AND TRADEMARK OFFICE
CERTIFICATE OF CORRECTION

PATENT NO. : 8,402,848 B2  
APPLICATION NO. : 12/681967  
DATED : March 26, 2013  
INVENTOR(S) : Joerg Kiesewetter, Stojan Kanev and Stefan Kreissig Page 1 of 1

It is certified that error appears in the above-identified patent and that said Letters Patent is hereby corrected as shown below:

In the Claims:

Column 4, line 43, claim 2, after "plate" please insert --are--

Signed and Sealed this  
Fourth Day of June, 2013

Teresa Stanek Rea  
*Acting Director of the United States Patent and Trademark Office*

UNITED STATES PATENT AND TRADEMARK OFFICE
CERTIFICATE OF CORRECTION

PATENT NO. : 8,402,848 B2  
APPLICATION NO. : 12/681967  
DATED : March 26, 2013  
INVENTOR(S) : Kiesewetter et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 390 days.

Signed and Sealed this
First Day of September, 2015

Michelle K. Lee
*Director of the United States Patent and Trademark Office*